United States Patent [19]
Wardwell

[11] Patent Number: 5,507,652
[45] Date of Patent: Apr. 16, 1996

[54] WEDGE CONNECTOR FOR INTEGRATED CIRCUITS

[75] Inventor: Robert H. Wardwell, Colorado Springs, Colo.

[73] Assignee: Hewlett-Packard Company, Palo Alto, Calif.

[21] Appl. No.: 390,194

[22] Filed: Feb. 17, 1995

[51] Int. Cl.[6] .................................................... H01R 9/09
[52] U.S. Cl. ........................... 439/68; 439/912; 324/754; 324/72.5
[58] Field of Search .............................. 439/482, 68, 912, 439/70; 324/754

[56] References Cited

U.S. PATENT DOCUMENTS 5,391,082  2/1995  Airhart ........................................ 439/68
5,463,324  10/1995  Wardell et al. ........................... 324/754

Primary Examiner—David L. Pirlot
Assistant Examiner—Yong Kim
Attorney, Agent, or Firm—Edward L. Miller

[57] ABSTRACT

A wedge connector for integrated circuits comprises tapered fingers of conductive metal separated by an insulator. The tapered fingers are wedge-shaped, in that they are thinnest at their tips, so that they may more easily enter the space between adjacent legs of an integrated circuit (IC). A row of wedges is assembled, and spaced apart to interdigitate with the legs of the IC. The IC legs have sides that face each other along the direction of the row, and that are separated by the amount of the inter-leg spacing. The tapered fingers or wedges penetrate into the inter-leg space and contact the facing sides of the IC legs. Thus, the left-hand side of a wedge entering a particular inter-leg space will come into electrical contact with the right-hand side of the IC leg on the left of that inter-leg space, and the right-hand side of that wedge will come into electrical contact with left-hand side of the IC leg on the right of that inter-leg space. As the depth of penetration is increased the thicker parts of the wedge enter the inter-wedge space, filling it completely and causing good wiping action and firm contact pressure between the sides of the IC legs and the sides of the wedges. Within the row of wedges, the left-hand side of each wedge is electrically connected to the right-hand side of its neighboring wedge on the right, which, by implication means that the right-hand side of each wedge is also electrically connected to the left-hand side of its neighboring wedge to the right. To increase wedge compliance air gaps are provided between those portions of wedge internal layers of material that correspond to the tapered portions of the wedge. Correct initial interdigitation is improved by beveling the ends of the conductive surfaces at the tips of the wedges. Bridging of the conductive surfaces by solder debris accumulation at the tip of the wedge is eliminated by a center piece of insulating material at the central core of the wedge extending beyond the tapered end of the wedge by a small amount. The beveling also assists by reducing the amount of solder accumulated to begin with.

3 Claims, 4 Drawing Sheets ns for a surface mount part with legs on 0.0197 inch (0.5 mm) centers they are close enough together that such an accident does not break the skin; but it can deform the wedges. This is more of an annoyance than a fatal result, as the wedges are usually readily reformed with the aid of an exacto knife blade under a low power microscope.

WEDGE CONNECTOR FOR INTEGRATED CIRCUITS

BACKGROUND OF THE INVENTION

A wedge connector for integrated circuits is known from U.S. patent application S/N 08/143,005, filed Oct. 26, 1993. The wedge connector described therein comprises tapered fingers of conductive metal separated by an insulator. The tapered fingers are wedge-shaped, in that they are thinnest at their tips, so that they may more easily enter the space between adjacent legs of an integrated circuit (IC). A row of tapered wedges (i.e., tapered fingers) is assembled, and spaced apart to interdigitate with the legs of the IC. That is, the legs of the IC also form a row with an amount of inter-leg spacing between the legs along the direction of the row. The IC legs have sides that face each other along the direction of the row, and that are separated by the amount of the inter-leg spacing. By interdigitation we mean that the tapered fingers or wedges penetrate into the inter-leg space and contact the facing sides of the IC legs. Thus, the left-hand side of a wedge entering a particular inter-leg space will come into electrical contact with the right-hand side of the IC leg on the left of that inter-leg space, and the right-hand side of that wedge will come into electrical contact with left-hand side of the IC leg on the right of that inter-leg space. As the depth of penetration is increased the thicker parts of the wedge enter the inter-leg space, filling it completely and causing good wiping action and firm contact pressure between the sides of the IC legs and the sides of the wedges.

Within the row of wedges, the left-hand side of each wedge is electrically connected to the right-hand side of its neighboring wedge on the right, which, by implication means that the right-hand side of each wedge is also electrically connected to the left-hand side of its neighboring wedge to the right. This interconnectedness of the wedges in a row thereof produces a very desirable effect: if there are n-many legs on the IC and n+1 wedges in a row, then each leg of the IC is in electrical contact at two different places with two different wedges. This adds a robust reliability to the wedge connector.

FIG. 1 herein (which is also FIGS. 1 in the above mentioned Application) illustrates generally the technique described above. It is to be noted that the wedges interdigitate with the facing sides of adjacent legs of the IC, and that no attempt is made to produce contact with the outer faces of the legs of the IC; instead, the wedges pass between the legs.

As advantageous as the above described wedge connection technique is, experience with wedge connectors as described in the '005 Application has revealed occasional problems in their use. In brief, it would sometimes happen that certain wedges of the connector would not make electrical contact to the corresponding legs of the IC, unless uncomfortably high forces were used to press the connector into place. A further consequence is increased difficulty in safe removal. This not only raises the worry of extra mechanical stress on the IC, but also of unintentional damage to the wedge connector by a process that is much like what can happen when an IC is removed from a tight socket using the thumb and forefinger. "Dual in-line thumb" results when the IC slips in the grasp and its legs end up being pressed painfully into the thumb. (A simple extraction tool resembling a teeny tiny crowbar is actually preferred for the task of wedge probe removal; however it is unfortunately subject to not always being at hand when needed.) The wedges are not really sharp, and for a surface mount part with legs on 0.0197 inch (0.5 mm) centers they are close enough together that such an accident does not break the skin; but it can deform the wedges. This is more of an annoyance than a fatal result, as the wedges are usually readily reformed with the aid of an exacto knife blade under a low power microscope.

Two things appear to produce the difficulties described above. One is non-uniformity in the inter-leg spaces of the IC (arising from variations in the dam bar removal process). The other is the stiffness of the individual wedges, which prevents easy conformance with variations in the inter-leg spaces. The idea is that a small inter-leg space requires more force to penetrate, and can stop overall penetration of the wedge probe overall before all wedges have made contact. (It does not appear that there is any variation in the center-to-center spacing of the IC legs, just in the size of the gap remaining between adjacent legs when the dam bar is chopped out.)

Another problem has also been experienced, which is the scraping off of solder from the tinned legs of the IC by the tips of the wedges. This can result in a collection of solder debris at the tip of a wedge that shorts the two sides of that wedge together. This is quite undesirable, as the two sides of a wedge are associated with two different legs of an IC, and shorting the sides of a wedge together then shorts those legs together when the wedge connector is installed on the IC.

It would be desirable, then, to increase the compressibility and side to side flexibility of the wedges so that they may better comply with variations in the leg-to-leg gaps for the run of IC's, thus reducing the insertion force needed to ensure contact between the wedges and the sides of the legs.

It would also be desirable to eliminate the accumulation of solder debris from the tips of the wedges.

It would be further desirable if the increased compressibility and flexibility and the defense against solder debris made easier the initial alignment of the wedge connector with the IC, and made the obtaining of such interdigitation easier to recognize when obtained.

SUMMARY OF THE INVENTION

A solution to the problem of wedge compliance is to fabricate the wedges with air gaps between those portions of their internal layers of material that correspond to the tapered portions of the wedge. This makes the wedges more compressible over their tapered region, as well as somewhat more bendable in the side-to-side direction. A related solution to the problem of ensuring correct initial interdigitation is to bevel the ends of the conductive surfaces at the tips of the wedges. This reduces the cross section of the wedges, making them "sharper" so that they more easily engage the empty inter-leg spaces. A solution to the problem of solder debris accumulation is to have a center piece of insulating material at the central core of the wedge extend beyond the tapered end of the wedge by a small amount, say ten thousandths of an inch. The beveling of the conductive sides of the tapered wedges also assists with solder debris abatement, as sharper edges present less of a shelf with which to gouge the solder and carry a build-up of scraped off solder debris.

DESCRIPTION OF A PREFERRED EMBODIMENT

Figure 1:
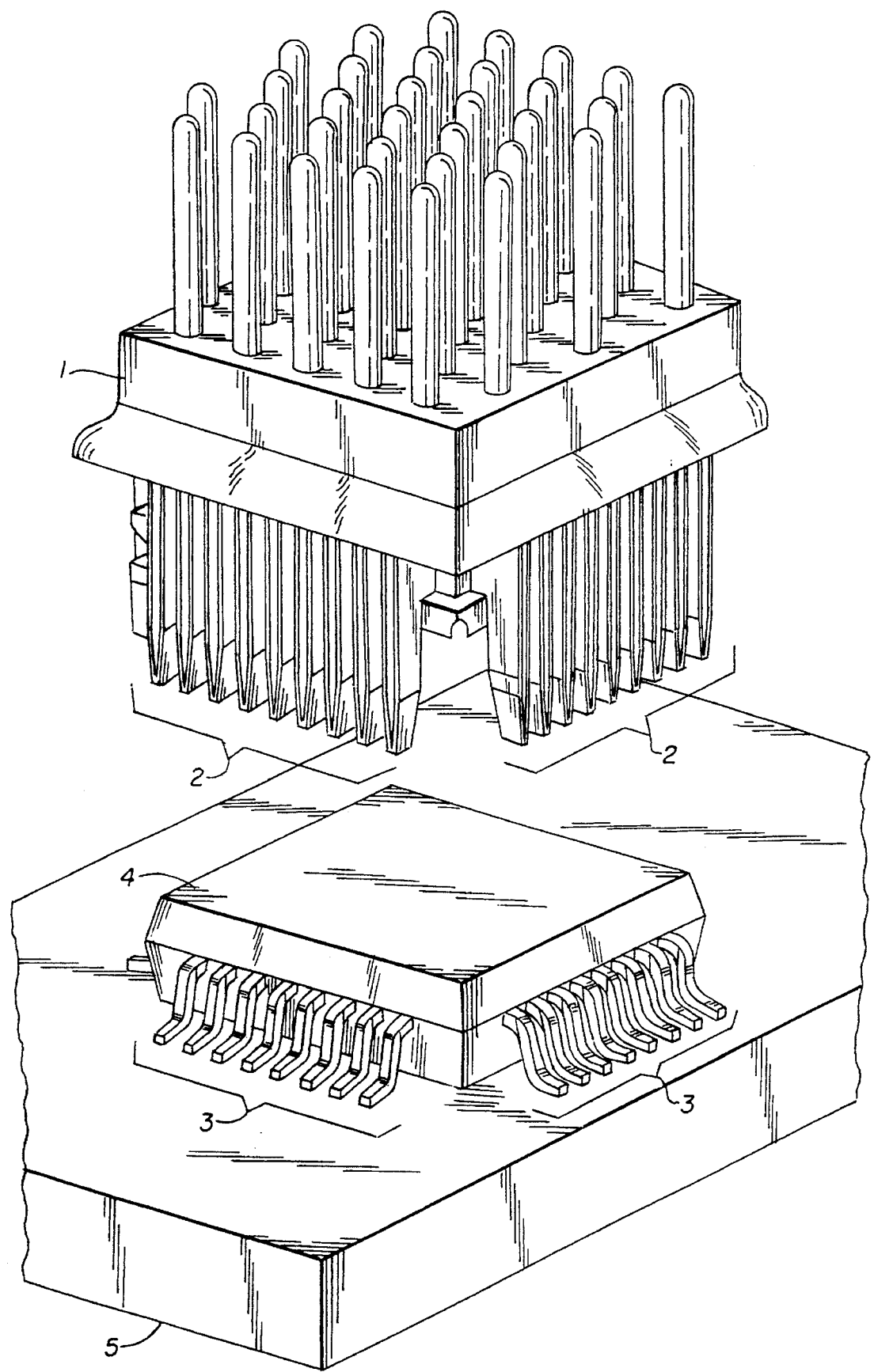
FIG. 1 is a perspective view of a wedge probe having four rows of wedges or tapered fingers positioned above an integrated circuit with whose four rows of legs the probe is to make contact by wedging tapered double sided conductors between those legs.

Refer now to FIG. 1, wherein is shown a perspective view of a wedge probe 1 having nine wedges per side 2 poised above an IC 4 with rows of legs 3 having eight legs per row. The IC 4 is mounted on a printed circuit board 5. The use of eight legs per side on the IC is not expected in actual experience (although such would not be impractical); twenty-five or more is likely. Eight legs per row 3 and nine wedges per side 2 are shown in the figure merely for clarity and ease of illustration. The details of the upper portion of the wedge probe concerning how the conductive surfaces of the wedges are connected to the pin block on top, and the exact manner of fabricating the wedges themselves, are thoroughly discussed in the '005 Application, and need not be repeated here.

Figure 2:
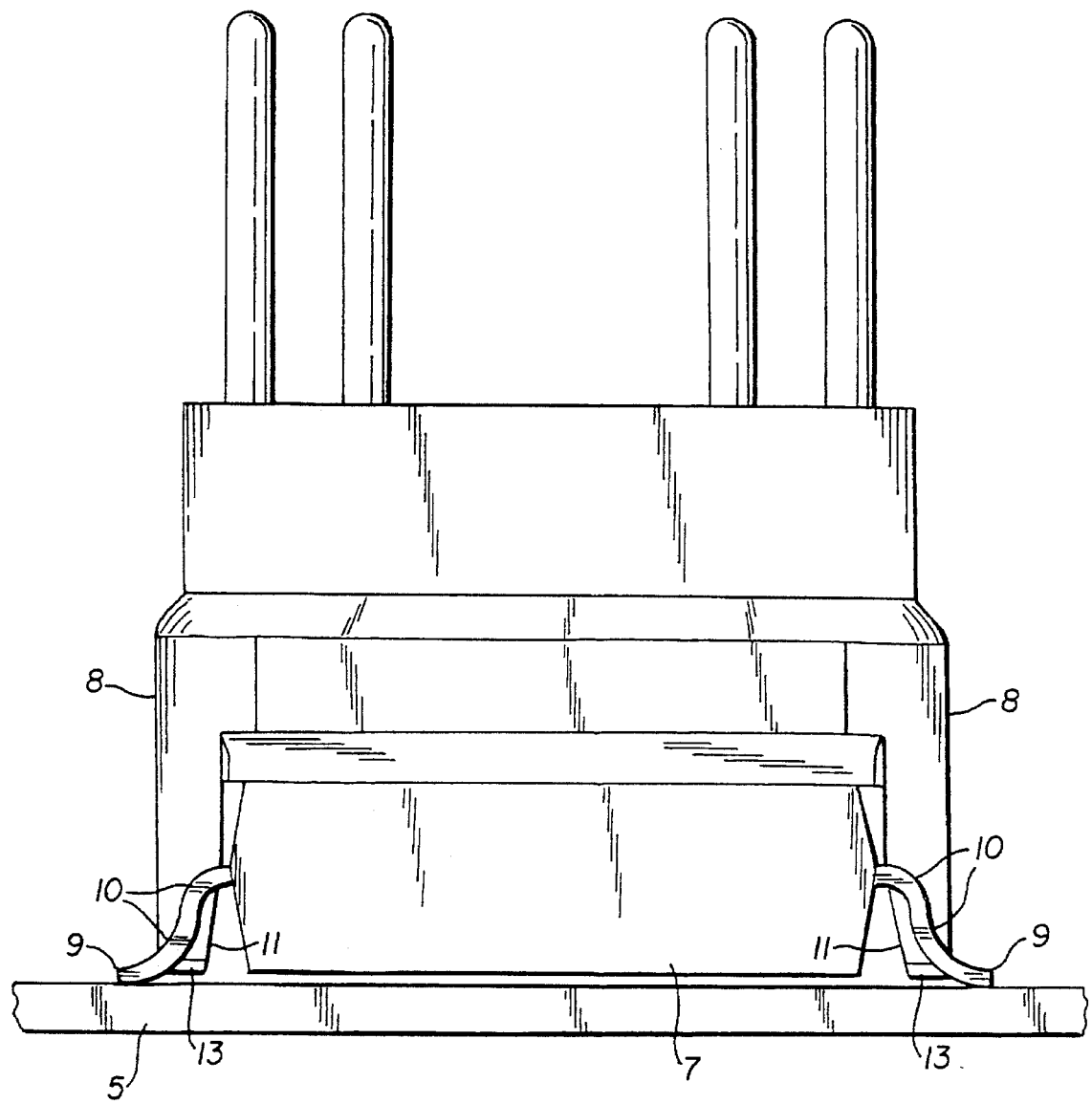
FIG. 2 is a an end view of an integrated circuit package having two rows of legs on the sides and being probed by a wedge probe similar to that of FIG. 1, except that, for clarity of view, it has but two rows of wedges.

FIG. 2 shows an end view of a situation similar to FIG. 1, except that the IC 7 has legs 9 only on two sides. This was done to allow an uncluttered end view without having to depict a row of legs face on. Clearly shown in the figure are wedges or tapered fingers 8 passing between legs 9. The region of contact between the wedges and the legs of the IC is substantially the S-curve 10 between where the legs exit the IC and bend down and where they bend back again to meet the board 5. Also shown is an angled edge 11 that assists in getting the wedge probe positioned over the IC.

Figure 3:
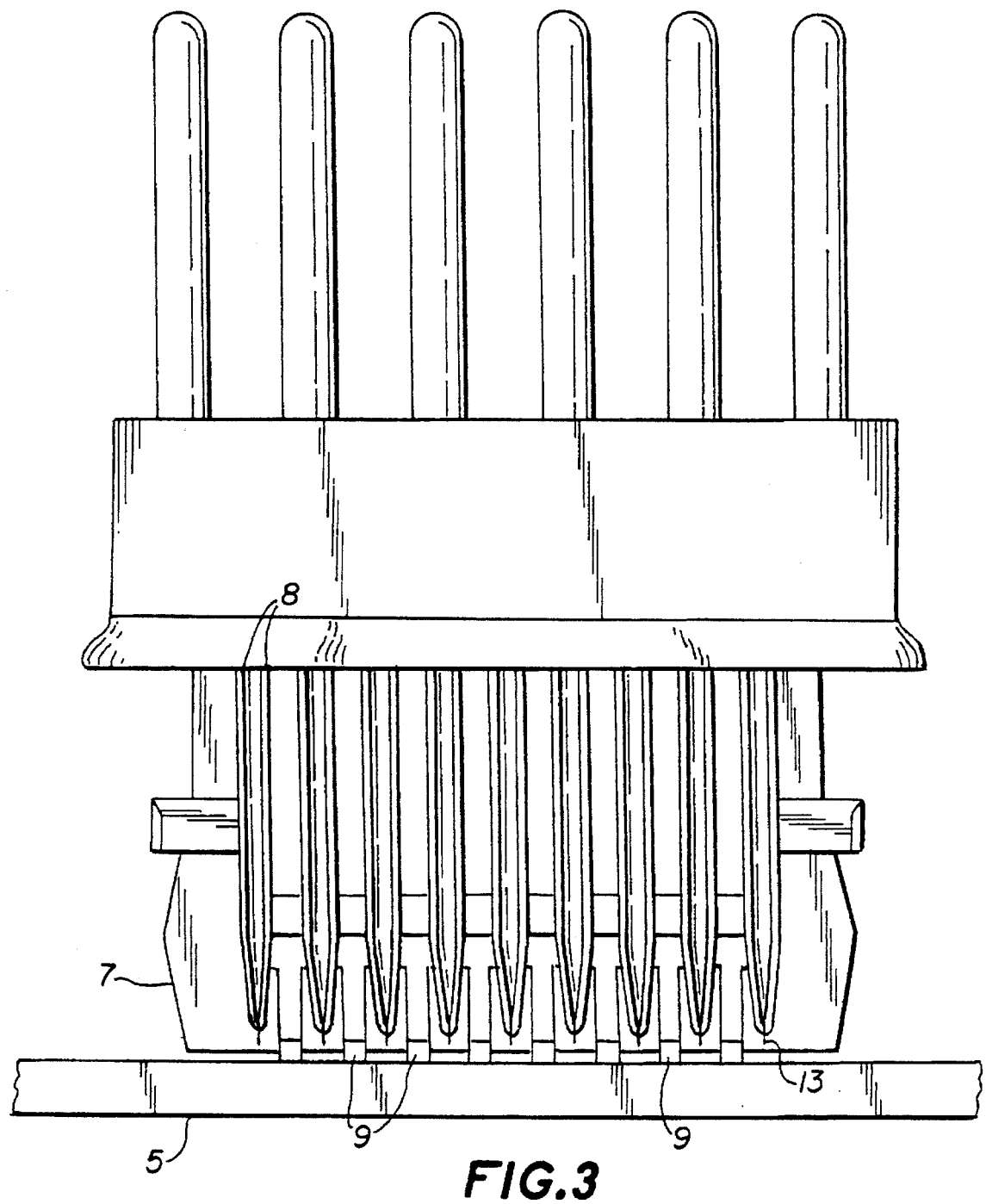
FIG. 3 is a side view of the arrangement of FIG. 2, and illustrates where on the legs of a standard surface mount IC the wedging occurs.
Figure 4:
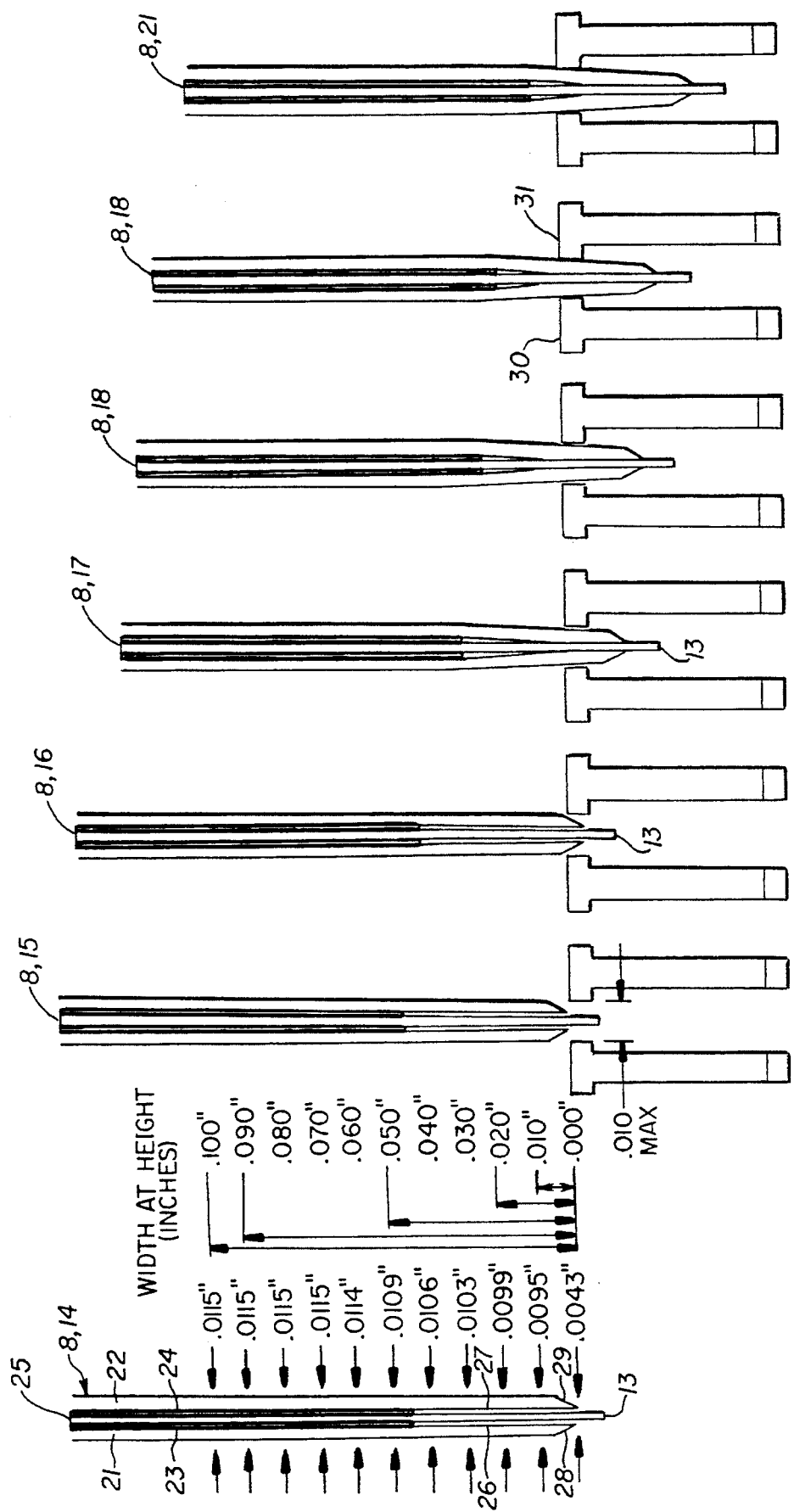
FIG. 4 is an edge view of improved wedges shown in varying degrees of penetration of the inter-leg gap between the legs on an integrated circuit.

FIG. 3 is the side view of the situation depicted in FIG. 2. In FIG. 2 the conductive sides 12 of the wedges 8 have been shown much thicker than they actually are, in order that they may be more clearly distinguished. Also, details of the interior portions of the wedges are left undepicted in favor of what is shown in FIG. 4, save that a sort piece of insulating material 13 extends downwards from the bottom of each wedge. This is also depicted in FIG. 2. Note also that the conductive surfaces have been beveled at the tips of the wedges.

The beveling of the wedge tips and the extending piece of insulating material 13 accomplish two purposes. First, they make the tips of the wedges sharper, in that the very tip occupies less distance in the direction along the row of wedges or legs. This assists in initially establishing preliminary interdigitation prior to full penetration of the inter-leg gap by the entire thickness of the wedges. It also helps prevent the electrical bridging of the two conductive sides of each wedge by solder debris. The extending piece of insulation is a mechanical barrier against bridging, and the beveled tips scrape less solder off the IC's legs to begin with, and also provide less of a shelf for it to accumulate upon, anyway.

A side view of the improved wedges (8, 14-20) is shown in FIG. 4. Referring now to wedge 14, note that it is made up of a sandwich of materials. On the outside are conductive surfaces 21 and 22 of 0.003"thick BeCu. A central core 25 is made of 0.002" thick polyimide. The conductive surfaces 21 and 22 are bonded to the central core 25 by respective layers 23 and 24 of adhesive that is 0.002" thick. Note that the adhesive layers 23 and 24 do not extend the full length of the wedge 14-20. Instead, they go only part way toward the tip, and thus provide air gaps 26 and 27. These add resilient compliance to the wedges when compressed between a pair of adjacent legs 30 and 31 of the IC. Notice also that the tips 28 and 29 of the conductive surfaces have been lapped to produce a bevel, and that the central core descends below the tip by a suitable amount, say, 0.010".

FIG. 4 shows two air gaps 26 and 27. Depending upon the thicknesses of the materials used, the degree of compressibility needed, and perhaps other factors, one air gap may be sufficient. That is, supposing air gap 27 were deemed unnecessary, adhesive layer 24 would extend the entire length of the wedges. In a related way, if a very thick wedge were required, built of additional layers of adhesive and insulation on each side of the the central core layer of insulation 25, such a thick wedge could have three or four air gaps to produce a corresponding amount of compressibility. Furthermore, these "extra" air gaps (not shown) might start at locations along the length of the wedge different from where the "original" air gaps (i.e., 26, 27) begin.

The finished thicknesses of wedge 14 are shown at different positions along the length of the wedge. The positions shown are in thousandths of an inch above the furthest extent of the beveled tips 28 and 29 of the conductive surfaces 21 and 22, and relate to an integrated circuit having a maximum of 0.010" inter-leg gap for legs that are on a center-to-center spacing of 0.0197" (0.5 mm).

Wedges 15-20 are depicted as poised at different heights above, and penetrating into, adjacent pairs of IC legs. Note the inward bowing action of wedges 19 and 20, as the air gaps 26 and 27 are consumed by substantial penetration of the wedges into the inter-leg gap of the IC. The inter-leg gap may be assumed to be 0.010" for the example shown in FIG. 4.

The results of using the improved wedge described above are dramatic. A wedge probe of the unimproved style for a 144 surface mount pan with legs on 0.0197" (0.5 mm) centers might require as much as forty pounds of force to effect installation, depending on the variations in actual leg-to-leg gaps for the individual integrated circuit. A wedge probe improved as described herein might require as little as ten pounds of force for installation on that same IC. This corresponds to a reduction to around one or two ounces of force per leg from as much as three or four ounces of force per leg of the integrated circuit.

I claim:

1. A wedge probe for connecting test equipment to the legs of an integrated circuit, the wedge probe comprising:

at least one row of n+1 tapered wedges spaced apart to interdigitate with a row of n legs of the integrated circuit;

each tapered wedge including first and second conductive surfaces separated by an insulator to which they are bonded on opposing sides by respective intervening first and second layers of adhesive;

each tapered wedge having a tip, that for tapered wedges interior to the row thereof enters the inter-leg gap between an adjacent pair of legs of the integrated circuit, and each tapered wedge also having a butt end attached to a support structure that physically anchors the tapered wedges in the row thereof and that performs electrical connection between the first and second conductive surfaces and the test equipment; and at least one of the first and second layers of adhesive being disposed only between the butt end of the tapered wedges and an interior location along the length of the tapered wedges that is between the butt end and the tip, the absence of adhesive between the interior location and the tip producing a gap between the associated one of the first and second conductive surfaces and the insulator.

2. A wedge probe as in claim 1 wherein the insulation extends beyond the tips of the tapered wedges.

3. A wedge probe as in claim 1 wherein the first and second conductive surfaces are beveled at the tips of the tapered wedges to form chisel points.

* * * * *